(12) United States Patent
Shin et al.

(10) Patent No.: US 11,971,248 B1
(45) Date of Patent: Apr. 30, 2024

(54) WAVELENGTH-TUNABLE FIBER OPTIC LIGHT SOURCE AND OVERLAY MEASUREMENT DEVICE WITH SAME

(71) Applicant: AUROS TECHNOLOGY, INC., Hwaseong-si (KR)

(72) Inventors: Hyeon Gi Shin, Hwaseong-si (KR); Seung Soo Lee, Osan-si (KR)

(73) Assignee: AUROS TECHNOLOGY, INC., Hwaseong-si (KR)

( * ) Notice: Subject to any disclaimer, the term of this patent is extended or adjusted under 35 U.S.C. 154(b) by 0 days.

(21) Appl. No.: 18/306,567

(22) Filed: Apr. 25, 2023

(30) Foreign Application Priority Data

Mar. 29, 2023 (KR) .......................... 10-2023-0041034

(51) Int. Cl.
| | |
|---|---|
| *G01B 11/27* | (2006.01) |
| *G02B 6/32* | (2006.01) |
| *G02B 6/42* | (2006.01) |
| *G02B 27/14* | (2006.01) |

(52) U.S. Cl.
CPC ............ *G01B 11/272* (2013.01); *G02B 6/325* (2013.01); *G02B 6/4215* (2013.01); *G02B 6/4298* (2013.01); *G02B 27/141* (2013.01)

(58) Field of Classification Search
CPC .... G01B 11/272; G02B 6/325; G02B 6/4215; G02B 6/4298; G02B 27/141
See application file for complete search history.

(56) References Cited

U.S. PATENT DOCUMENTS

| | | | | |
|---|---|---|---|---|
| 5,217,285 A | * | 6/1993 | Sopori .................... | F21S 8/006 362/1 |
| 6,590,149 B2 | * | 7/2003 | Adelhelm .............. | G01M 11/00 136/246 |
| 2003/0169423 A1 | * | 9/2003 | Finarov ............... | G03F 7/70633 356/401 |
| 2010/0014080 A1 | * | 1/2010 | Jungwirth ............. | G01J 1/0403 356/326 |
| 2010/0271799 A1 | * | 10/2010 | Jungwirth ............. | G01J 1/0422 362/293 |
| 2015/0309339 A1 | * | 10/2015 | Yu ........................ | G02F 1/0147 359/288 |

(Continued)

FOREIGN PATENT DOCUMENTS

| | | | |
|---|---|---|---|
| JP | 06302881 A | 10/1994 | |
| JP | H06302881 A | * 10/1994 | ......... H01S 3/06791 |

(Continued)

*Primary Examiner* — Dominic J Bologna
(74) *Attorney, Agent, or Firm* — NKL Law; Jae Youn Kim (57) ABSTRACT

A wavelength-tunable fiber optic light source and an overlay measurement device including a wavelength-tunable fiber optic light source are provided. A wavelength-tunable fiber optic light source may include a broadband light source configured to emit light; a light source housing to receive the broadband light source, wherein in the light source housing, a first window and a second window through which the light emitted from the broadband light source passes are formed; a first variable filter configured to adjust a wavelength band of a first illumination; a second variable filter configured to adjust a wavelength band of a second illumination; and a fiber combiner including an output port through which a combination of the first illumination and the second illumination is output.

13 Claims, 10 Drawing Sheets

(56) References Cited

U.S. PATENT DOCUMENTS

2022/0035258 A1\* 2/2022 Lee .......................... G03F 7/20
2022/0326008 A1\* 10/2022 Park ................... G03F 7/70633

FOREIGN PATENT DOCUMENTS

| | | | | |
|---|---|---|---|---|
| JP | 2006509219 A | \* | 6/2004 | ........... G03F 9/7088 |
| JP | 2005-519460 A | | 6/2005 | |
| JP | 2010141283 A | \* | 6/2010 | ............ H01S 3/067 |
| JP | 2010141283 A | | 6/2010 | |
| JP | 2019528444 A | \* | 10/2019 | ............... G01J 3/12 |
| KR | 2003-0054781 A | | 7/2003 | |
| KR | 10-0689709 B1 | | 3/2007 | |
| KR | 10-1564312 B1 | | 10/2015 | |
| KR | 10-2018-0042649 A | | 4/2018 | |
| KR | 10-2018-0045026 A | | 5/2018 | |
| KR | 20200031744 A | \* | 3/2020 | ......... G02B 27/0955 |
| KR | 20200031744 A | | 3/2020 | |
| KR | 10-2120551 B1 | | 6/2020 | |
| KR | 20210031015 A | \* | 3/2021 | ............. G01B 11/27 |

\* cited by examiner

WAVELENGTH-TUNABLE FIBER OPTIC LIGHT SOURCE AND OVERLAY MEASUREMENT DEVICE WITH SAME

CROSS REFERENCE TO RELATED APPLICATION

The present application claims priority to Korean Patent Application No. 10-2023-0041034, filed Mar. 29, 2023, the entire content of which is incorporated herein for all purposes by this reference.

BACKGROUND

Field of the Invention

The present disclosure relates to a fiber optic light source and an overlay measurement device including the fiber optic light source. More particularly, the present disclosure relates to a wavelength-tunable fiber optic light source capable of changing the wavelength of output light, and an overlay measurement device including the wavelength-tunable fiber optic light source.

Description of the Related Art

As technology develops, there are demands to reduce the size of semiconductor devices and to increase the density of integrated circuits on the semiconductor device. In order to meet these requirements, various important conditions must be satisfied. Overlay tolerance is one of these important conditions.

Semiconductor devices are manufactured through numerous manufacturing processes. In order to form an integrated circuit on a wafer, many manufacturing processes need to be performed to sequentially form desired circuit structures and elements at particular locations. The manufacturing processes generate patterned layers on the wafer sequentially. Through repeated laminating processes, electrically active patterns are generated in the integrated circuit. Herein, if the structures are not aligned within an error range allowed in the production process, interference occurs between the electrically active patterns and this phenomenon may cause problems in performance and reliability of the manufactured circuit. An overlay measurement tool is used to measure and verify the alignment errors between the layers.

General overlay measurement methods are used to measure and verify whether alignment between two layers is within tolerance. As one of the methods, there is a method of forming a structure called an overlay mark at a particular location on a substrate and photographing the structure with an optical imaging device to measure an overlay. Structures for measurement are designed such that an overlay in the X direction or Y direction or both is measured for each layer. Structures are designed to be symmetrical. The center value between the structures arranged in a symmetrical direction is calculated to be used as a representative value of the layer. A relative difference between the representative values of the respective layers is calculated to derive an overlay error.

Figure 1:
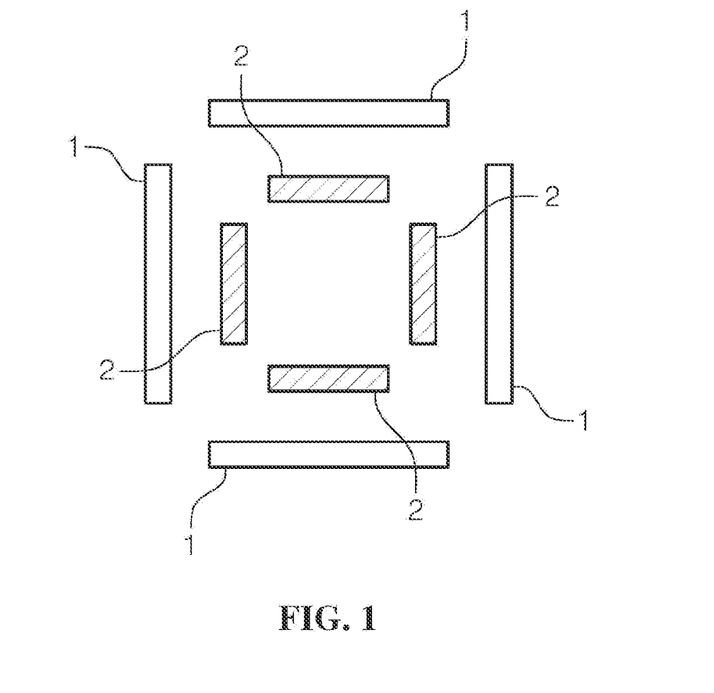
FIG. 1 is a plan view of overlay marks.
Figure 2:
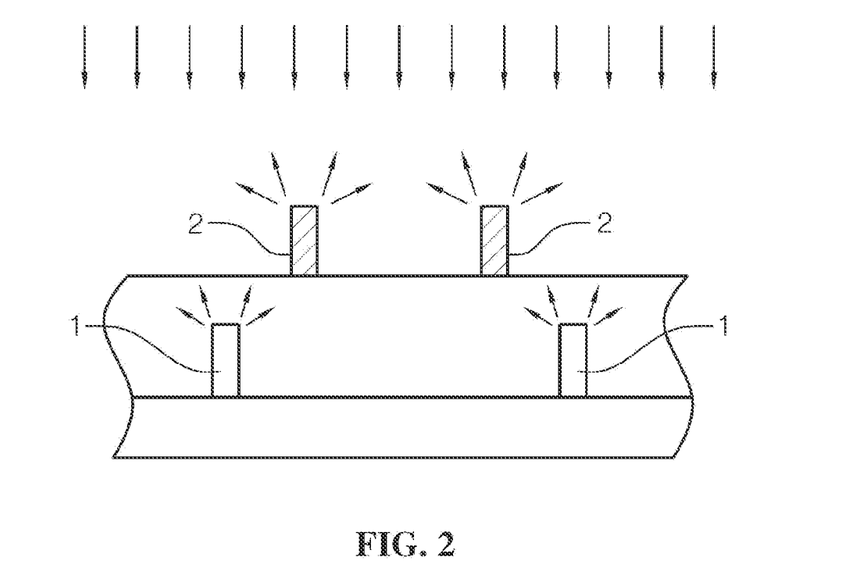
FIG. 2 is a side view of the overlay marks shown in FIG. 1.
Figure 3:
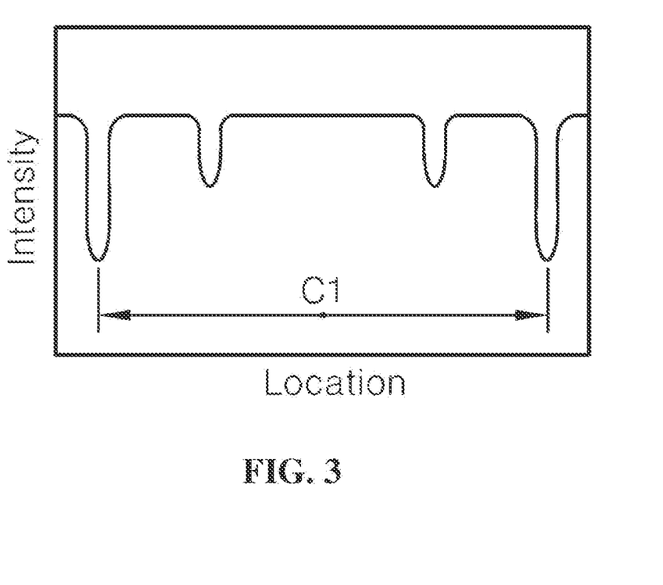
FIG. 3 is a diagram of waveform of a signal showing change in intensity by location, wherein the signal is obtained while main scales of the overlay marks shown in FIG. 1 are in focus.
Figure 4:
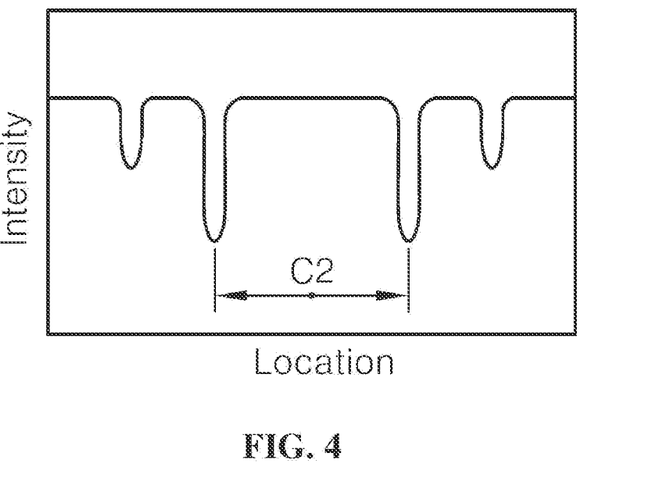
FIG. 4 is a diagram of waveform of a signal showing change in intensity by location, wherein the signal is obtained while sub scales of the overlay marks shown in FIG. 1 are in focus.

In the case of measuring an overlay of two layers, as shown in FIGS. 1 and 2, quadrangular main scales 1 (outer boxes) and quadrangular sub scales 2 (inner boxes), which are smaller than the main scales 1, are formed on two consecutive layers, respectively. Next, as shown in FIG. 3 with the main scales 1 in focus, the waveform showing a change in intensity by location is obtained and a center value C1 of the main scales 1 is obtained. As shown in FIG. 4 with the sub scales 2 in focus, the waveform showing a change in intensity by location is obtained and a center value C2 of the sub scales 2 is obtained. Accordingly, an overlay error between the two layers is measured.

However, in this conventional method, there may be a big difference in height between the layer on which the main scales 1 are formed and the layer on which the sub scales 2 are formed. When there is a big difference and the main scales 1 are in focus, the sub scales 2 are out of focus and are blurred. When there is a big difference and the sub scales 2 are in focus, the main scales 1 are out of focus and are blurred.

In addition, the same beam is used to obtain the waveforms or images of the main scales 1 and the sub scales 2 without considering that the main scales 1 and the sub scales 2 are formed of different materials and on different layers and without considering that the main scales 1 are covered by the layer on which the sub scales 2 are formed.

Due to the development of semiconductor processing technology, the height difference is large and it is necessary to accurately and rapidly measure an overlay error between layers having different optical properties. Currently, there is an increasing demand for solving these problems.

The foregoing is intended merely to aid in the understanding of the background of the present disclosure, and is not intended to indicate that the present disclosure falls within the purview of the related art that is already known to those skilled in the art.

DOCUMENTS OF RELATED ART (Patent Document 1) Korean Patent Application Publication No. 2003-0054781;
(Patent Document 2) Korean Patent No. 10-0689709;
(Patent Document 3) Korean Patent No. 10-1564312;
(Patent Document 4) Korean Patent Application Publication No. 10-2018-0042649;
(Patent Document 5) Korean Patent Application Publication No. 10-2018-0045026;
(Patent Document 6) Japanese Patent Application Publication No. 2005-519460; and
(Patent Document 7) Korean Patent No. 10-2120551.

SUMMARY

The present disclosure is directed to providing a wavelength-tunable fiber optic light source capable of generating beams that are appropriate to illuminate overlay marks including overlay structures formed of materials having different optical properties and formed on different layers.

In addition, the present disclosure is directed to providing a new overlay measurement device that includes the above-described wavelength-tunable fiber optic light source and is capable of accurately and rapidly measuring an overlay error between different layers with optical properties.

According to one or more embodiments of the present disclosure, there is provided a wavelength-tunable fiber optic light source including a broadband light source configured to emit light; a light source housing including an interior space to accommodate the broadband light source, a first window through which light emitted from the broadband light passes to form a first illumination, and a second window through which light emitted from the broadband light source passes to form a second illumination; a first variable filter placed in an optical path of the first illumination that has passed through the first window, and configured to adjust a wavelength band of the first illumination;

a second variable filter placed in an optical path of the second illumination that has passed through the second window, and configured to adjust a wavelength band of the second illumination; and a fiber combiner including a first input port and a second input port through which the first illumination that has passed through the first variable filter and the second illumination that has passed through the second variable filter are input, respectively; and an output port through which a combination of the first illumination and the second illumination is output.

According to one or more embodiments, a wavelength-tunable fiber optic light source may further include a first lens assembly configured to gather and direct the first illumination, which has passed through the first window, toward the first variable filter; and a second lens assembly configured to gather and direct the second illumination, which has passed through the second window, toward the second variable filter.

According to one or more embodiments, a wavelength-tunable fiber optic light source, the first lens assembly may include a collimating lens and a focusing lens through which the light that has passed through the first window passes in that order, and the second lens assembly may include a collimating lens and a focusing lens through which the light that has passed through the second window passes in that order.

According to one or more embodiments, a wavelength-tunable fiber optic light source may further include a third lens assembly configured to gather and direct the first illumination, which has passed through the first variable filter, toward the first input port; and a fourth lens assembly configured to gather and direct the second illumination, which has passed through the second variable filter, toward the second input port.

According to one or more embodiments of a wavelength-tunable fiber optic light source, the third lens assembly may include a collimating lens and a focusing lens through which the light that has passed through the first variable filter passes in that order, and the fourth lens assembly may include a collimating lens and a focusing lens through which the light that has passed through the second variable filter passes in that order.

According to one or more embodiments of a wavelength-tunable fiber optic light source, the wavelength band of the first illumination and the wavelength band of the second illumination may be different from each other.

According to one or more embodiments of a wavelength-tunable fiber optic light source, the wavelength band of the first illumination and the wavelength band of the second illumination may be the same.

According to one or more embodiments of the present disclosure there is provided an overlay measurement device for measuring an interlayer overlay error of a sample on which overlay marks, which include a first overlay mark and a second overlay mark respectively formed on different layers, are formed, the overlay measurement device including: an illumination optical system configured to illuminate the overlay marks on the sample; a main beam splitter configured to split light reflecting off the overlay marks into a first beam and a second beam; a first detector configured to receive the first beam and generate a first overlay mark image in which the first overlay mark is in focus; a second detector configured to receive the second beam and generate a second overlay mark image in which the second overlay mark is in focus; a first imaging optical system configured to image the first beam on the first detector; and a second imaging optical system configured to image the second beam on the second detector, wherein the illumination optical system includes a wavelength-tunable fiber optic light source.

According to one or more embodiments, the sample may be a semiconductor wafer.

According to one or more embodiments, an overlay measurement device may further include a height difference detection optical system configured to detect a height difference ($\Delta h$) between the first overlay mark and the second overlay mark, wherein the second imaging optical system may be a telecentric imaging optical system including an optical path adjuster configured to adjust a length of an optical path of the second beam on the basis of the height difference; and a telecentric lens placed between the main beam splitter and the second detector, and configured to image the second beam on the second detector.

According to one or more embodiments of an overlay measurement device, the optical path adjuster may include one or more mirrors placed between the main beam splitter and the second detector, and configured to reflect the second beam toward the second detector; a mirror stage configured to adjust the length of the optical path of the second beam by linearly moving at least one of the one or more mirrors; and a controller configured to control the mirror stage on the basis of the height difference.

According to one or more embodiments of an overlay measurement device, the controller may be configured to control the mirror stage such that the optical path of the second beam is extended in proportion to a product of the height difference and a magnification of the second overlay mark image and such that the extended optical path of the second beam is longer than an optical path of the frst beam.

According to one or more embodiments of an overlay measurement device, the frst variable filter may be configured to adjust the wavelength band of the frst illumination for detection of the first overlay mark on a first layer of the different layers by the first detector.

According to one or more embodiments of an overlay measurement device, the second variable filter may be configured to adjust the wavelength band of the second illumination for detection of the second overlay mark on a second layer of the different layers by the second detector.

According to one or more embodiments of an overlay measurement device, the wavelength band of the first illumination and the wavelength band of the second illumination are different from each other.

According to one or more embodiments of an overlay measurement device, the wavelength band of the first illumination and the wavelength band of the second illumination are the same.

According to one or more embodiments, an overlay measurement device may further include a detector controller configured to synchronize the first detector and the second detector.

According to one or more embodiments of an overlay measurement device, the detector controller generates a software synchronization signal and transmits the synchronization signal to the first detector and the second detector.

According to one or more embodiments, an overlay measurement device may further include a focus actuator to adjust a position of the second detector.

According to one or more embodiments of an overlay measurement device, the second imaging optical system may include a zoom lens, which is positioned between the main beam splitter and the focus actuator; and the adjustable second detector and the zoom lens may be configured to image the second beam on the second detector.

According to the present disclosure, the wavelength-tunable fiber optic light source is capable of generating illuminations that are appropriate to illuminate overlay marks including overlay structures formed of materials having different optical properties and formed on different layers.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION

Hereinafter, embodiments of the present disclosure will be described in detail with reference to the accompanying drawings. It should be understood that the embodiments of the present disclosure may be changed to a variety of embodiments and the scope of the present disclosure is not limited to the embodiments described hereinbelow. The embodiments of the present disclosure are provided in order to fully describe the disclosure for those of ordinary skill in the art. Therefore, shapes and sizes of the elements in the drawings may be exaggerated for a more precise description. Throughout the drawings, the elements denoted by the same reference numerals refer to the same elements.

Figure 5:
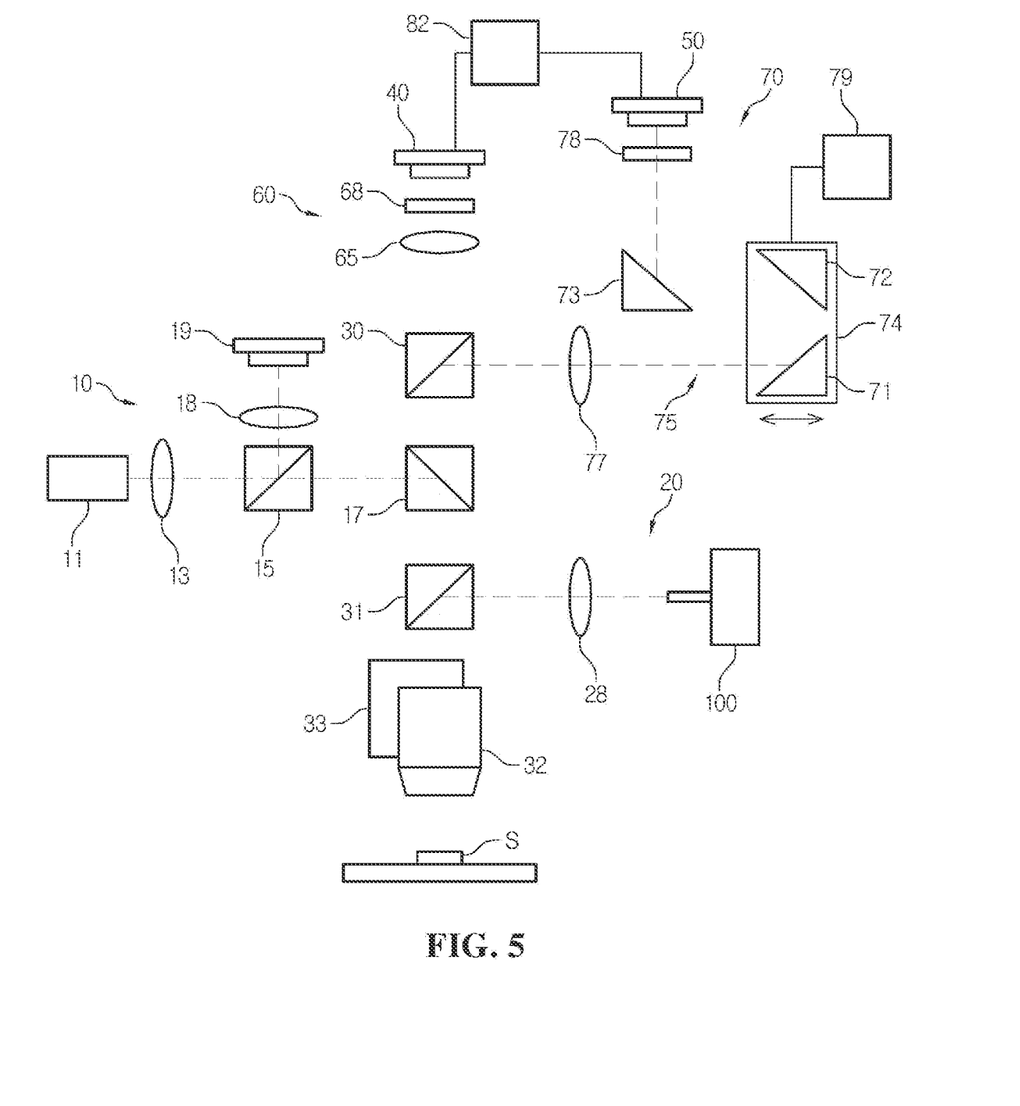
FIG. 5 is a schematic diagram of an overlay measurement device according to an embodiment of the present disclosure.

FIG. 5 is a schematic diagram of an overlay measurement device according to an embodiment of the present disclosure. The overlay measurement device is a device for measuring an overlay error between different layers by measuring an error between a first overlay mark OM1 and a second overlay mark OM2 respectively formed on different layers of a sample, such as a semiconductor wafer. A sample may be denoted by the letter S in the drawings.

Figure 10:
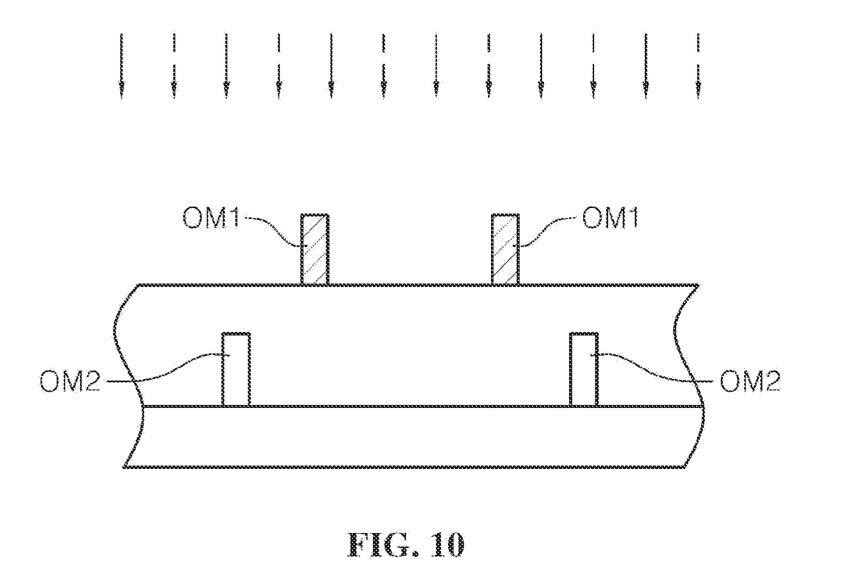
FIG. 10 is a diagram illustrating a method of irradiating a first overlay mark and a second overlay mark formed on a sample with illumination.

For example, as shown in FIG. 10, the second overlay mark OM2 may be an overlay mark formed on the previous layer, and the first overlay mark OM1 may be an overlay mark formed on the current layer. The overlay marks are formed on a scribe lane and a layer for forming a semiconductor device is formed in a die area of the semiconductor wafer, simultaneously. For example, the second overlay mark OM2 may be formed together with an insulation film pattern, and the first overlay mark OM1 may be formed together with a photoresist pattern formed on the insulation film pattern.

In this case, the first overlay mark OM1 is exposed to the outside, but the second overlay mark OM2 is covered by a photoresist layer and is made of an oxide having an optical property different from that of the first overlay mark OM1 made of a photoresist material. In addition, the first overlay mark OM1 and the second overlay mark OM2 differ in height.

According to the present disclosure, while the first overlay mark OM1 is in focus, beams appropriate for the optical property of the material constituting the first overlay mark OM1 are used to obtain a first overlay mark image I1. In addition, while the second overlay mark OM2 is in focus, beams appropriate for the optical property of the material constituting the second overlay mark OM2 are used to obtain a second overlay mark image I2. The first overlay mark image I1 and the second overlay mark image I2 may be used to measure an overlay error accurately and rapidly.

Various shapes of overlay marks, such as box-in-box (BIB, see FIG. 1) overlay marks, advanced imaging metrology (AIM) overlay marks, etc., currently used may be used as the overlay marks. Hereinafter, a description will be given based on the case of box-in-box overlay marks that generally have a simple structure.

As shown in FIG. 5, an overlay measurement device according to an embodiment of the present disclosure includes a height difference detection optical system 10, an illumination optical system 20, a main beam splitter 30, a first detector 40, a second detector 50, a first imaging optical system 60, and a second imaging optical system 70.

The height difference detection optical system 10 measures a height difference $\Delta h$ between the first overlay mark OM1 and the second overlay mark OM2. The height difference detection optical system 10 may be configured using various optical elements. The height difference detection optical system 10 may also be used as an optical system for automatic focusing.

For example, as shown in FIG. 5, the height difference detection optical system 10 may include a light source 11, a collimator 13 (collimating lens), a beam splitter 15, and an image sensor 19. The collimator 13 (collimating lens) collimates beams from the light source 11. In addition, the height difference detection optical system 10 may further include a hot mirror 17, a beam splitter 31, and an objective lens 32 that are shared with the first imaging optical system 60, the illumination optical system 40, and the second imaging optical system 70.

As the light source 11, a laser diode or a light emitting diode may be used. The light source 11 may generate light in an infrared wavelength band.

The light generated by the light source 11 passes through the collimator 13 and the beam splitter 15. When a laser is used as the light source 11, a polarizing beam splitter may be used as the beam splitter 15. This is because there is a decrease in the amount of light in a reflection and a penetration process can be minimized.

The hot mirror 17 reflects the light in the infrared wavelength band. The light reflecting off the hot mirror 17 passes through the beam splitter 31 and is incident on the objective lens 32.

The objective lens 32 concentrates the light onto a measurement location on the surface of the sample S and collects the reflected light reflecting off the measurement location on the surface of the sample S. The reflected light collected by the objective lens 32 passes back through the beam splitter 31 and reflects off the hot mirror 17. The reflected light reflecting off the hot mirror 17 reflects off the beam splitter 15 toward the image sensor 19 and is concentrated on the image sensor 19 by a focusing lens 18. Since the light in the infrared wavelength band does not pass through the hot mirror 17, the light used for measuring the height difference is not incident on the first detector 40.

The image sensor 19 receives the reflected light from the sample S. The image sensor 19 may be a CCD sensor or a CMOS sensor. The contrast of an image from the image sensor 19 is analyzed to determine whether the focus is achieved. Therefore, an optical signal from the image sensor 19 according to the distance between the objective lens 32 and the sample S is analyzed to determine the position of the objective lens 32 when the first overlay mark OM1 is in focus and the position of the objective lens 32 when the second overlay mark OM2 is in focus. The positions are compared to determine the height difference Δh between the first overlay mark OM1 and the second overlay mark OM2.

The illumination optical system 20 illuminates the overlay marks. The illumination optical system 20 may be configured using various optical elements. For example, as shown in FIG. 5, the illumination optical system 20 may include a wavelength-tunable fiber optic light source 100, and a relay lens 28. In addition, the beam splitter 31 and the objective lens 32 may also be used as part of the illumination optical system 20.

Figure 6:
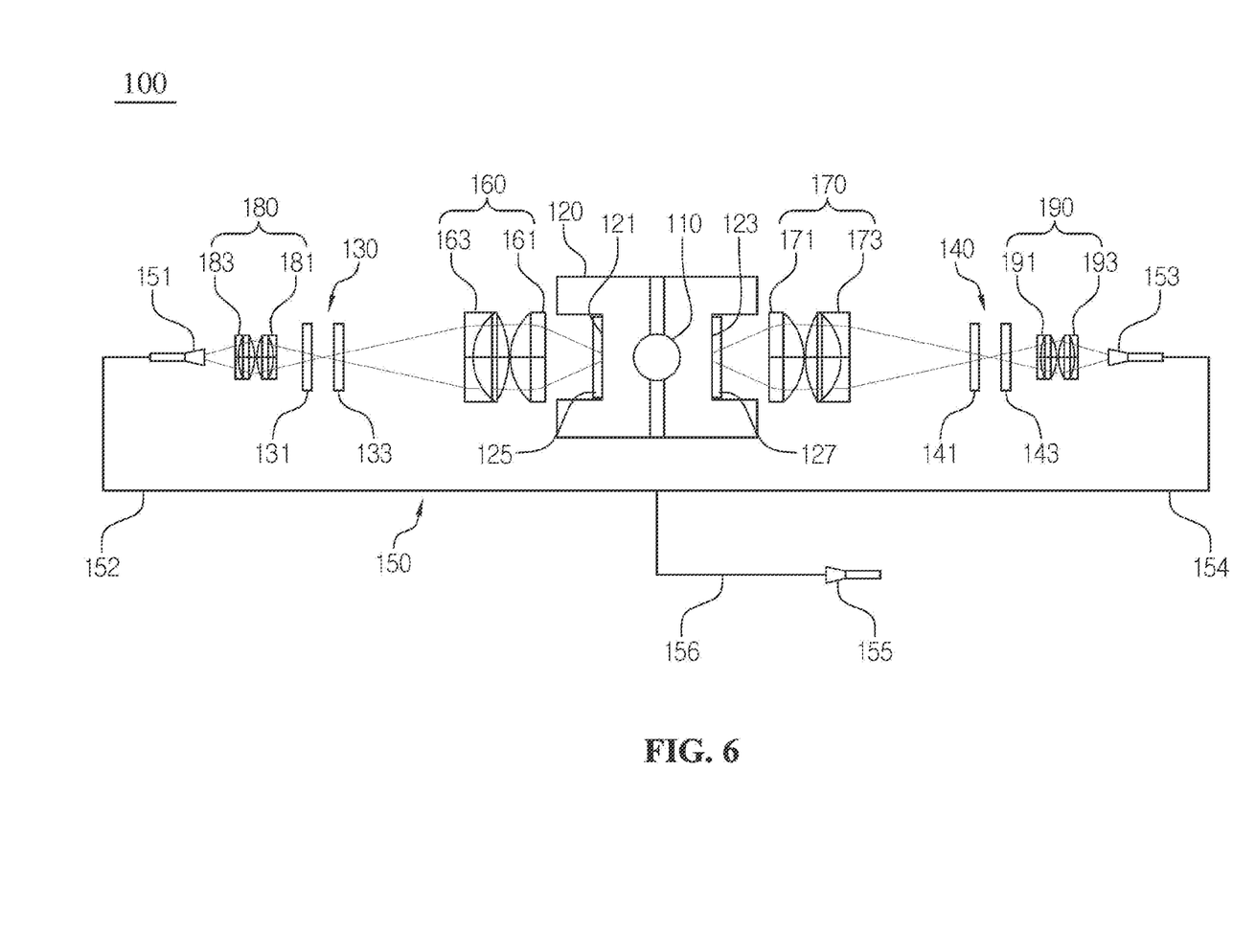
FIG. 6 is a schematic diagram of a wavelength-tunable fiber optic light source shown in FIG. 5 according to an embodiment of the present disclosure.

FIG. 6 is a schematic diagram of an embodiment of the wavelength-tunable fiber optic light source shown in FIG. 5. As shown in FIG. 6, the wavelength-tunable fiber optic light source 100 includes a broadband light source 110, a light source housing 120, a first variable filter 130, a second variable filter 140, a fiber combiner 150, a first lens assembly 160, a second lens assembly 170, a third lens assembly 180, and a fourth lens assembly 190.

The broadband light source 110 generates light in a wide wavelength band. The broadband light source 110 emits light in all directions. As the broadband light source 110, an arc lamp, a discharge lamp, an electrodeless lamp, a halogen lamp, a xenon lamp, or the like may be used.

The light source housing 120 has an interior space receiving the broadband light source 110. The interior space accommodates the broadband light source 110. The light source housing 120 has a first window 121 and a second window 123 through which the light emitted from the broadband light source 110 passes. Light emitted from the broadband light source and passing through a first window forms a first illumination. Light emitted from the broadband light source and passing through a second window forms a second illumination. The first window 121 and the second window 123 are provided with first cover glass 125 and second cover glass 127, respectively. The first cover glass 125 and the second cover glass 127 protect the broadband light source 110 from external damage factors. In addition, light in an unused wavelength band may be blocked in advance.

The first variable filter 130 adjusts the central wavelength and the band width of first illumination that has passed through the first window 121 to be appropriate for detection of the first overlay mark OM1 formed on the current layer. For example, the central wavelength may be adjusted to increase reflectance with respect to the material constituting the first overlay mark OM1. The first variable filter 130 may include a plurality of circular or linear variable filters 131 and 133 arranged side by side, for example. The first variable filter 130 may include a circular or linear variable filter.

Figure 7:
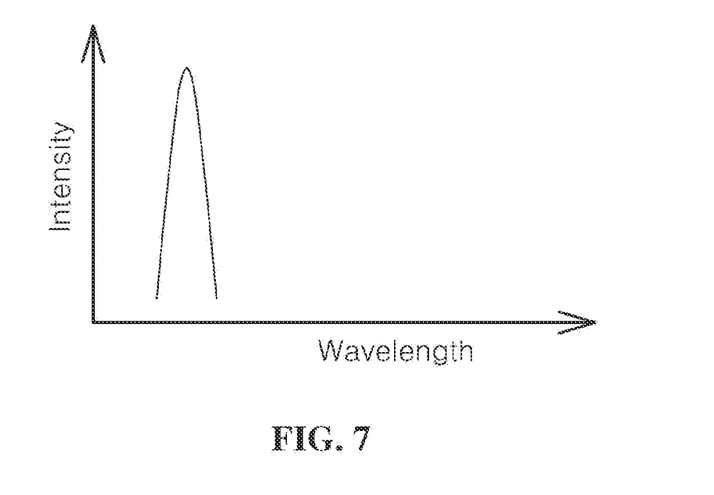
FIG. 7 is a diagram illustrating the intensity according to the wavelength of first illumination that has passed through a first variable filter shown in FIG. 6.

FIG. 7 is a diagram illustrating the intensity according to the wavelength of the first illumination that has passed through the first variable filter shown in FIG. 6. As shown in FIG. 7, the first illumination that has passed through the first variable filter 130 has a shorter central wavelength and a reduced band width. The first illumination that has passed through the first variable filter 130 may be illumination in a visible light region.

The second variable filter 140 adjusts the central wavelength and the band width of second illumination that has passed through the second window 123 to be appropriate for detection of the second overlay mark OM2 formed on the previous layer. For example, the central wavelength may be adjusted to increase transmittance with respect to the material constituting the first overlay mark OM1 and increase reflectance with respect to the material constituting the second overlay mark OM2. The second variable filter 140 may include a plurality of circular or linear variable filters 141 and 143 arranged side by side, for example. The second variable filter 130 may include a circular or linear variable filter.

Figure 8:
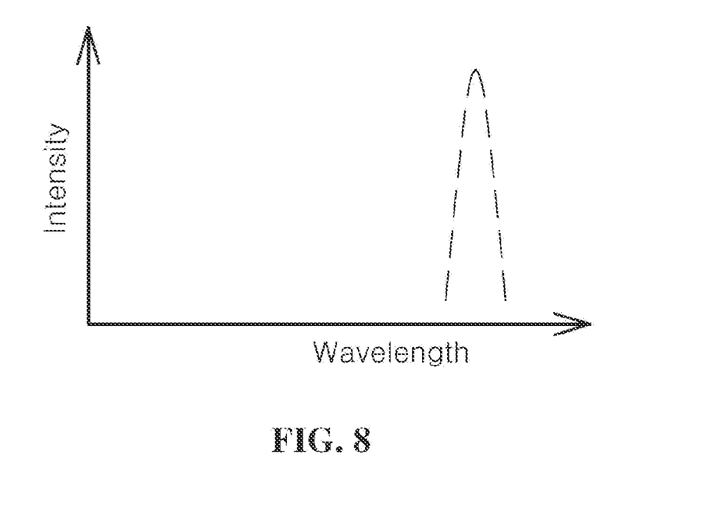
FIG. 8 is a diagram illustrating the intensity according to the wavelength of second illumination that has passed through a second variable filter shown in FIG. 6.

FIG. 8 is a diagram illustrating the intensity according to the wavelength of second illumination that has passed through the second variable filter shown in FIG. 6. As shown in FIG. 8, the second illumination that has passed through the second variable filter 140 has a longer central wavelength and a reduced band width. The second illumination that has passed through the second variable filter 140 may be illumination in a near-infrared (NIR) region.

The fiber combiner 150 combines the first illumination and the second illumination. The fiber combiner has lower loss, compared to other types of beam combiners that use a beam splitter, a mirror, etc. By using the fiber combiner, illumination with a larger amount of light by about 60% may be obtained.

The fiber combiner 150 includes a first input port 151 and a second input port 153 through which the first illumination that has passed through the first variable filter 130 and the second illumination that has passed through the second variable filter 140 are input, respectively. In addition, the fiber combiner 150 includes an output port 155 through which a combination of the first illumination and the second illumination is output. The first illumination input through the first input port 151 is guided by a first input fiber 152. The second illumination input through the second input port 153 is guided by a second input fiber 154. The first illumination and the second illumination are combined at a position where the first input fiber 152 and the second input fiber 154 meet. The combination is guided by an output fiber 156 and output through the output port 155.

Figure 9:
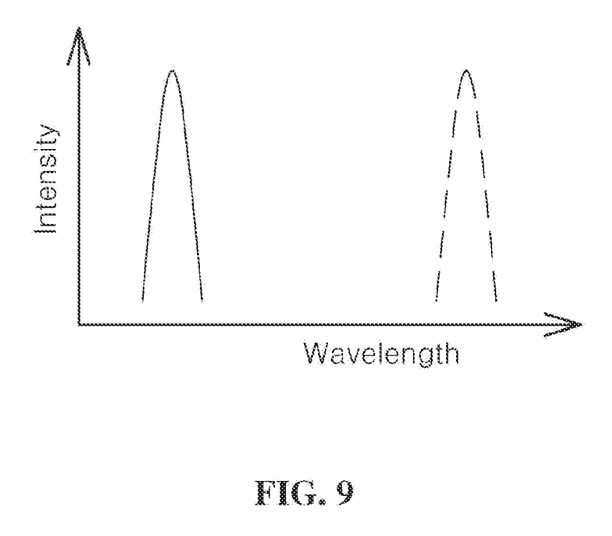
FIG. 9 is a diagram illustrating the intensity according to the wavelength of illumination that has passed through a fiber combiner shown in FIG. 6.

FIG. 9 is a diagram illustrating the intensity according to the wavelength of illumination that has passed through the fiber combiner shown in FIG. 6. As shown in FIG. 9, the illumination that has passed through the fiber combiner 150 includes both the wavelength band of the first illumination and the wavelength band of the second illumination.

When it is necessary to secure a sufficient amount of light, unlike the example shown in FIG. 9, the first illumination and the second illumination may be the same in wavelength band. In this case, about twice the amount of light may be obtained.

The first lens assembly 160 gathers and directs the first illumination that has passed through the first window 121, toward the first variable filter 130. The first lens assembly 160 may include a collimating lens 161 and a focusing lens 163 through which the light that has passed through the first window 121 passes in that order.

The second lens assembly 170 gathers and directs the second illumination that has passed through the second window 123, toward the second variable filter 140. The second lens assembly 170 may include a collimating lens (collimator) 171 and a focusing lens 173 through which the light that has passed through the second window 123 passes in that order.

The third lens assembly 180 gathers the first illumination that has passed through the first variable filter 130, toward the first input port 151. The third lens assembly 180 may include a collimating lens (collimator) 181 and a focusing lens 183 through which the light that has passed through the first variable filter 130 passes in that order.

The fourth lens assembly 190 gathers the second illumination that has passed through the second variable filter 140, toward the second input port 153. The fourth lens assembly 190 may include a collimating lens (collimator) 191 and a focusing lens 193 through which the light that has passed through the second variable filter 140 passes in that order.

The illumination emitted from the wavelength-tunable fiber optic light source 100 passes through the relay lens 28 and reflects off the beam splitter 31 toward the objective lens 32.

The objective lens 32 concentrates the illumination reflecting off the beam splitter 31 onto the measurement location on the sample S, and collects beams reflecting off the measurement location. The objective lens 32 is provided in a lens focus actuator 33 for adjusting the distance between the objective lens 32 and the sample S.

As shown in FIG. 10, the sample S is irradiated with the first illumination (solid line) and the second illumination (dotted line) together through the illumination optical system 20.

The main beam splitter 30 splits the beams collected by the objective lens 32 into two beams. The main beam splitter 30 may be a beam splitter 30 for dividing the incident light into two output beams that are distinguished in terms of spectrum. For example, the main beam splitter 30 may include a tube beam splitter and a dichroic filter. The dichroic filter is a filter that transmits a beam of a particular wavelength. The beams collected by the objective lens 32 pass through the beam splitter 31 and the hot mirror 17, and are split into two beams by the main beam splitter 30. That is, the beams are split into a first beam for detecting the first overlay mark OM1 and a second beam for detecting the second overlay mark OM2. The first beam may have substantially the same wavelength band as the first illumination, and the second beam may have the same wavelength band as the second illumination.

As shown in FIGS. 7 and 8, the first illumination appropriate for detecting the first overlay mark OM1 and the second illumination appropriate for detecting the second overlay mark OM2 differ in central wavelength and have narrow band widths, so the first illumination and the second illumination are split into the two beams easily using the dichroic filter.

The first detector 40 generates the first overlay mark image I1 by receiving the first beam, which is one of the beams split by the main beam splitter 30.

Figure 11:
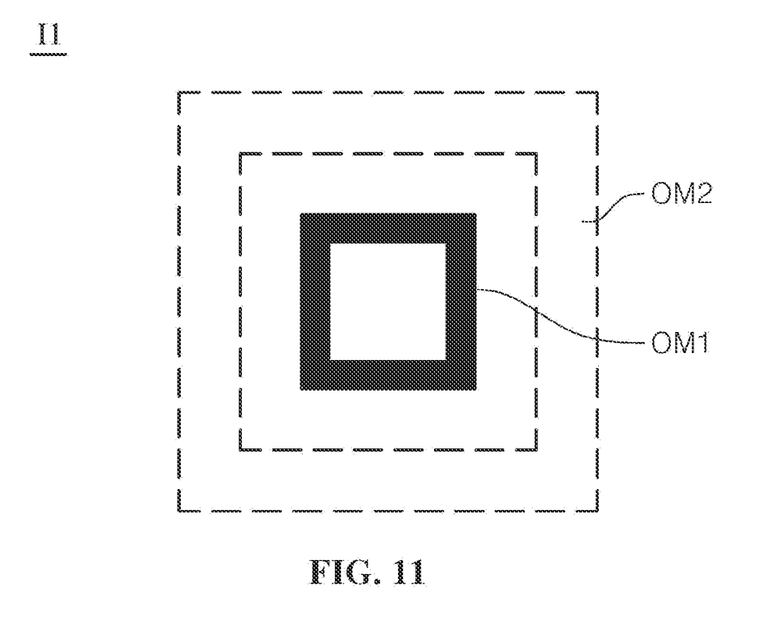
FIG. 11 is a diagram illustrating a first overlay mark image obtained by a first detector shown in FIG. 5.

FIG. 11 is a diagram illustrating the first overlay mark image I1 obtained by the first detector shown in FIG. 5. As shown in FIG. 11, the first overlay mark image I1 obtained by the first detector 40 shows the first overlay mark OM1 clearly and shows the second overlay mark OM2 unclearly. This is because the first overlay mark OM1 is in focus.

The second detector 50 generates the second overlay mark image I2 by receiving the second beam, which is the other one of the beams split by the main beam splitter 30.

The second detector 50 may be synchronized with the first detector 40. This is to minimize an error that may occur due to vibration during the overlay measurement process. Synchronization of the first detector 40 and the second detector 50 may be performed, for example, in a manner in which a detector controller 82 generates a software synchronization signal and transmits the same to the detectors 40 and 50. Herein, in order to prevent signal delay, the generated synchronization signal may be transmitted to the detectors 40 and 50 via an optical cable. A synchronization signal may be generated by a separate external trigger source. A detector controller 82 may include one or more processors and one or more memories storing executable instructions to be executed by one or more processors.

Figure 12:
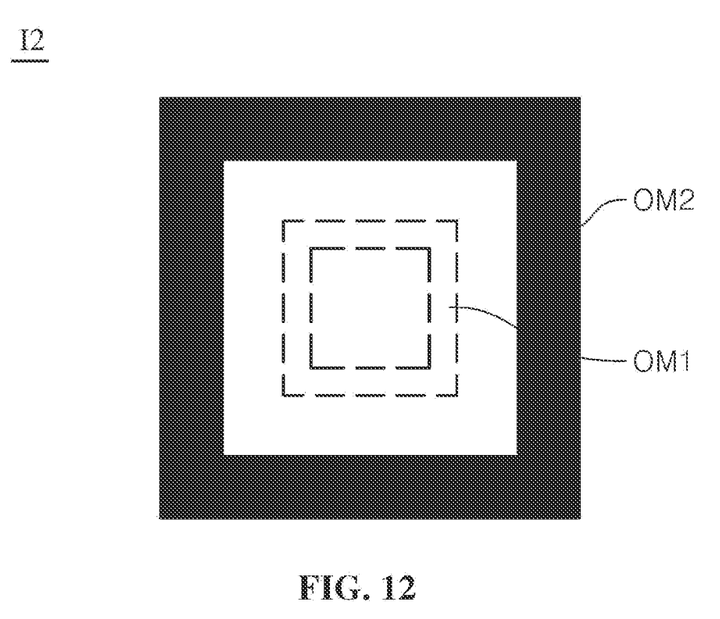
FIG. 12 is a diagram illustrating a second overlay mark image obtained by a second detector shown in FIG. 5.

FIG. 12 is a diagram illustrating the second overlay mark image I2 obtained by the second detector shown in FIG. 5. As shown in FIG. 12, the second overlay mark image I2 obtained by the second detector 50 shows the second overlay mark OM2 clearly and shows the first overlay mark OM1 unclearly. This is because the optical path of the second beam is adjusted by the second imaging optical system 70 so that the second overlay mark OM2 is in focus.

Figure 13:
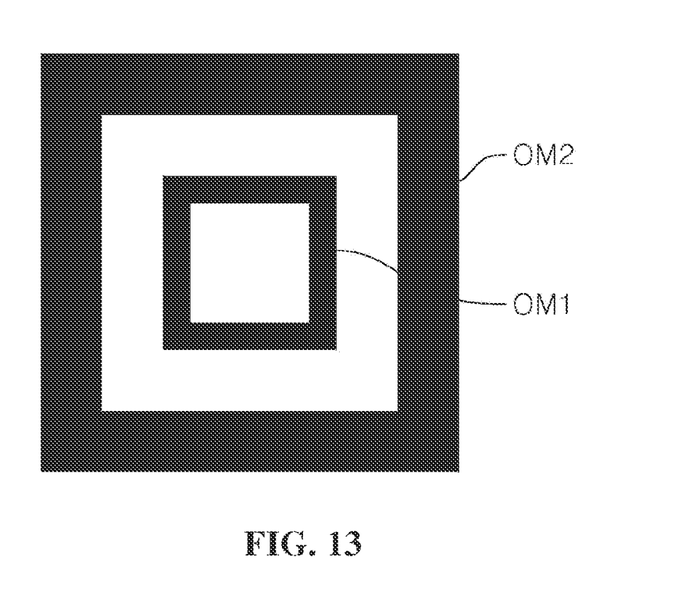
FIG. 13 is a diagram illustrating an image obtained by combining the first overlay mark image and the second overlay mark image.

By aligning and combining the image of FIG. 11 and the image of FIG. 12, an overlay mark image showing both the first overlay mark OM1 and the second overlay mark OM2 clearly may be obtained as shown in FIG. 13.

The first imaging optical system 60 images the first beam on the first detector 40.

As shown in FIG. 5, the first imaging optical system 60 may include a tube lens 65 and a first optical filter 68. In addition, the first imaging optical system 60 uses the objective lens 32, the beam splitter 31, the hot mirror 17, and the main beam splitter 30 of the other optical systems.

The objective lens 32 collects the light reflecting off the sample S. The light collected by the objective lens 32 is split into the first beam and the second beam by the main beam splitter 30. The first beam that has passed through the main beam splitter 30 is concentrated on the first detector 40 by the tube lens 65. Herein, the first overlay mark OM1 is in focus. Accordingly, the first overlay mark image I1 generated by the first detector 40 shows the first overlay mark OM1 clearly and shows the second overlay mark OM2 relatively unclearly.

The first optical filter 68 is placed in front of the first detector 40, and secondarily adjusts the central wavelength and the band width of the first beam to obtain the first overlay mark image I1. The first optical filter 68 may include a plurality of linear or rotary variable filters arranged side by side. The first optical filter 68 may include a linear or rotary variable filter. In some embodiment, the first optical filter 68 may be omitted.

The second imaging optical system 70 images the second beam on the second detector 50 by adjusting the length of the optical path of the second beam on the basis of the height difference Δh between the first overlay mark OM1 and the second overlay mark OM2. In addition, the second imaging optical system 70 enables the principal ray of the second beam to be perpendicularly incident on the second detector 50. It is preferable that the second imaging optical system 70 is a telecentric imaging optical system.

The second imaging optical system 70 includes an optical path adjuster 75, a telecentric lens 77, and a second optical filter 78.

The optical path adjuster 75 includes mirrors 71, 72, and 73, a mirror stage 74, and a controller 79. A controller 79 may include one or more processors and one or more memories storing executable instructions to be executed by one or more processors. The mirrors 71, 72, and 73 reflect the second beam reflecting off the main beam splitter 30 to enable the second beam to be incident on the second detector 50. In this embodiment, the optical path adjuster 75 includes the three mirrors 71, 72, and 73.

The mirror stage 74 may linearly move the two mirrors 71 and 72, which are placed on the right side of the drawing, simultaneously. When the two mirrors 71 and 72 are moved to the right in the drawing, the distance between the main beam splitter 30 and the mirror 71 and the distance between the mirrors 72 and 73 increase and the optical path is thus increased.

The controller 79 adjusts the moving distance of the mirror stage 74 on the basis of the height difference Δh. The controller 79 moves the mirror stage 74 on the basis of the product of the height difference Δh and the magnification of the second overlay mark image I2 so that the entire optical path of the second beam is longer than the entire optical path of the first beam. The magnification of the second overlay mark image I2 denotes the ratio between the actual size of the second overlay mark OM2 and the size of the second overlay mark in the image. The magnification of the second overlay mark image I2 may be equal to the magnification of the first overlay mark image I1.

The telecentric lens 77 enables the length of the optical path of the second beam and the magnification of an image to be independent. The telecentric lens 77 is a lens for enabling an optical axis and the principal ray of the second beam to be regarded as parallel. The telecentric lens 77 may be placed between the main beam splitter 30 and the second detector 50. For example, the telecentric lens 77 may be placed between the main beam splitter 30 and the optical path adjuster 75.

In the present disclosure, since the telecentric lens 77 is used, the magnification of the second overlay mark image I2 is fixed even if the optical path of the second beam is changed. Accordingly, without changing the magnification, focus is achieved by adjusting the moving distance of the mirror stage 74 in proportion to the measured height difference Δh. The second overlay mark image I2 generated by the second detector 50 shows the second overlay mark OM2 clearly and shows the first overlay mark OM1 relatively unclearly.

The second optical filter 78 is placed in front of the second detector 50, and secondarily adjusts the central wavelength and the band width of the second beam to obtain the second overlay mark image I2. The second optical filter 78 may include a plurality of linear or rotary variable filters arranged side by side. The second optical filter 78 may include a linear or rotary variable filter. In this embodiment, the second optical filter 78 may be omitted.

Figure 14:
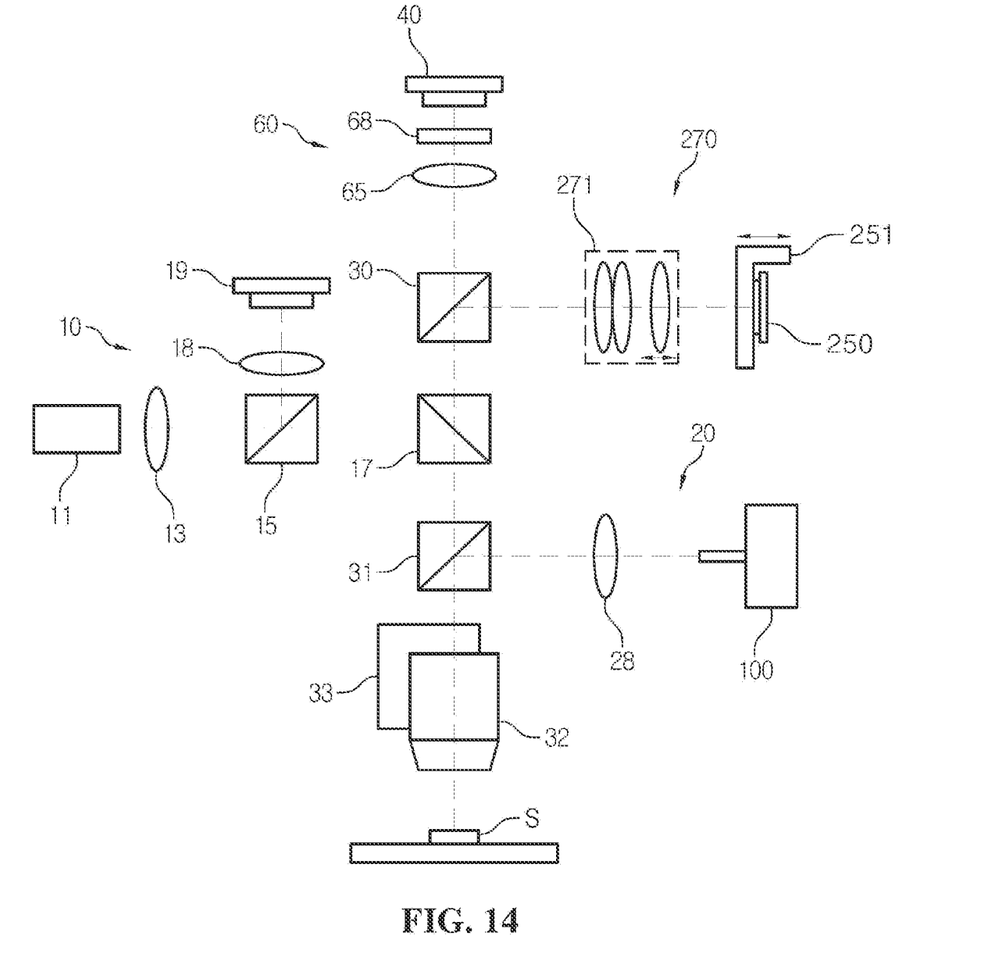
FIG. 14 is a schematic diagram of an overlay measurement device according to another embodiment of the present disclosure.

FIG. 14 is a schematic diagram of an overlay measurement device according to another embodiment of the present disclosure. The embodiment shown in FIG. 14 and the embodiment shown in FIG. 5 differ only in the configuration of a second imaging optical system 270 and a second detector 250, so only the difference will be described in detail.

The second detector 250 detects beams reflecting off a main beam splitter 30. The second detector 250 is provided in a focus actuator 251. Accordingly, a distance between the main beam splitter and the second detector 250 may be adjustable.

A distance between an objective lens 32 and a sample S is adjusted so that a first overlay mark OM1 is in focus with respect to a first imaging optical system 60. Therefore, in order to obtain a clear image of a second overlay mark OM2, the focus actuator 251 is used to adjust the distance between the second detector 250 and the main beam splitter 30 according to a height difference between the first overlay mark OM1 and the second overlay mark OM2. The focus actuator 251 may operate on the basis of a signal from a height difference detection optical system 10.

In this embodiment, the second imaging optical system 270 includes a zoom lens 271. In addition, the objective lens 32, a beam splitter 31, a hot mirror 17, and the main beam splitter 30 may also be used as part of the second imaging optical system 270.

The zoom lens 271 is provided between the main beam splitter 30 and the focus actuator 251. The zoom lens 271 receives a location change value of the second detector 250 from the height difference detection optical system 10 or the focus actuator 251, and matches, on the basis of the value, magnifications of an image of the first overlay mark OM1 and an image of the second overlay mark OM2.

According to the height difference between the first overlay mark OM1 and the second overlay mark OM2, an optical path distance between the second detector 250 and the main beam splitter 30 is adjusted to be different from an optical path distance between a first detector 40 and the main beam splitter 30. Therefore, the image obtained by the first detector 40 and the image obtained by the second detector 250 may differ in magnification. The magnifications need to be matched in order to measure an accurate overlay error. In the embodiment shown in FIG. 5, since a telecentric imaging optical system is used as the second imaging optical system 70, a zoom lens may not be used.

The embodiments described above are merely exemplary embodiments of the present disclosure, and the scope of the present disclosure is not limited to the above-described embodiments. Various changes, modifications, or substitutions may be made by those skilled in the art without departing from the technical idea of the present disclosure and claims. It should be understood that such embodiments fall within the scope of the present disclosure.

What is claimed is:

1. An overlay measurement device for measuring an interlayer overlay error of a sample on which overlay marks, which include a first overlay mark and a second overlay mark respectively formed on different layers, are formed, the overlay measurement device comprising:

an illumination optical system configured to illuminate the overlay marks on the sample;

a main beam splitter configured to split light reflecting off the overlay marks into a first beam and a second beam;

a first detector configured to receive the first beam and generate a first overlay mark image in which the first overlay mark is in focus;

a second detector configured to receive the second beam and generate a second overlay mark image in which the second overlay mark is in focus;

a first imaging optical system configured to image the first beam on the first detector; and a second imaging optical system configured to image the second beam on the second detector, wherein the illumination optical system comprises the wavelength-tunable fiber optic light source, and wherein the wavelength-tunable fiber optic light source comprises:

a broadband light source configured to emit light;

a light source housing including an interior space to accommodate the broadband light source, a first window through which light emitted from the broadband light source passes to form a first illumination, and a second window through which light emitted from the broadband light source passes to form a second illumination;

a first variable filter placed in an optical path of the first illumination that has passed through the first window, and configured to adjust a wavelength band of the first illumination;

a second variable filter placed in an optical path of the second illumination that has passed through the second window, and configured to adjust a wavelength band of the second illumination; and a fiber combiner including a first input port and a second input port through which the first illumination that has passed through the first variable filter and the second illumination that has passed through the second variable filter are input, respectively; and an output port through which a combination of the first illumination and the second illumination is output.

2. The overlay measurement device of claim 1, further comprising:

a height difference detection optical system configured to detect a height difference (Δh) between the first overlay mark and the second overlay mark, wherein the second imaging optical system is a telecentric imaging optical system including an optical path adjuster configured to adjust a length of an optical path of the second beam on the basis of the height difference; and a telecentric lens placed between the main beam splitter and the second detector, and configured to image the second beam on the second detector.

3. The overlay measurement device of claim 2, wherein the optical path adjuster comprises:

one or more mirrors placed between the main beam splitter and the second detector, and configured to reflect the second beam toward the second detector;

a mirror stage configured to adjust the length of the optical path of the second beam by linearly moving at least one of the one or more mirrors; and a controller configured to control the mirror stage on the basis of the height difference.

4. The overlay measurement device of claim 3, wherein the controller is configured to control the mirror stage such that the optical path of the second beam is extended in proportion to a product of the height difference and a magnification of the second overlay mark image and such that the extended optical path of the second beam is longer than an optical path of the first beam.

5. The overlay measurement device of claim 1, wherein the sample is a semiconductor wafer.

6. The overlay measurement device of claim 1, wherein the first variable filter is configured to adjust the wavelength band of the first illumination for detection of the first overlay mark on a first layer of the different layers by the first detector.

7. The overlay measurement device of claim 1, wherein the second variable filter is configured to adjust the wavelength band of the second illumination for detection of the second overlay mark on a second layer of the different layers by the second detector.

8. The overlay measurement device of claim 1, wherein the wavelength band of the first illumination and the wavelength band of the second illumination are different from each other.

9. The overlay measurement device of claim 1, wherein the wavelength band of the first illumination and the wavelength band of the second illumination are the same.

10. The overlay measurement device of claim 1, further comprising a detector controller configured to synchronize the first detector and the second detector.

11. The overlay measurement device of claim 10, wherein the detector controller generates a software synchronization signal and transmits the synchronization signal to the first detector and the second detector.

12. The overlay measurement device of claim 1, further comprising a focus actuator to adjust a position of the second detector.

13. The overlay measurement device of claim 12, wherein:

the second imaging optical system includes a zoom lens, which is positioned between the main beam splitter and the focus actuator; and wherein the adjustable second detector and the zoom lens are configured to image the second beam on the second detector.

* * * * *